United States Patent
Van Dijk et al.

(10) Patent No.: US 11,300,889 B2
(45) Date of Patent: Apr. 12, 2022

(54) METROLOGY APPARATUS

(71) Applicant: ASML NETHERLANDS B.V., Veldhoven (NL)

(72) Inventors: Leon Paul Van Dijk, Eindhoven (NL); Richard Johannes Franciscus Van Haren, Waalre (NL); Subodh Singh, Eindhoven (NL); Ilya Malakhovsky, Eindhoven (NL); Ronald Henricus Johannes Otten, Rosmalen (NL); Amandev Singh, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/267,974

(22) PCT Filed: Jul. 3, 2019

(86) PCT No.: PCT/EP2019/067885
§ 371 (c)(1),
(2) Date: Feb. 11, 2021

(87) PCT Pub. No.: WO2020/038642
PCT Pub. Date: Feb. 27, 2020

(65) Prior Publication Data
US 2021/0165335 A1  Jun. 3, 2021

(30) Foreign Application Priority Data
Aug. 22, 2018 (EP) ................................. 18190150

(51) Int. Cl.
*G03F 7/20* (2006.01)

(52) U.S. Cl.
CPC ...... *G03F 7/70783* (2013.01); *G03F 7/70433* (2013.01); *G03F 7/70616* (2013.01)

(58) Field of Classification Search
CPC ............. G03F 7/70433; G03F 7/70616; G03F 7/70633; G03F 7/70783
See application file for complete search history.

(56) References Cited

U.S. PATENT DOCUMENTS

| 6,952,253 B2 | 10/2005 | Lof et al. |
| 2011/0172982 A1 | 7/2011 | Veeraraghavan et al. |

(Continued)

FOREIGN PATENT DOCUMENTS

| TW | 200509201 | 3/2005 |
| WO | 2016209625 | 12/2016 |

(Continued)

OTHER PUBLICATIONS

International Search Report and Written Opinion issued in corresponding PCT Patent Application No. PCT/EP2019/067885, dated Oct. 28, 2019.

(Continued)

*Primary Examiner* — Peter B Kim
(74) *Attorney, Agent, or Firm* — Pillsbury Winthrop Shaw Pittman LLP (57) ABSTRACT

Methods and apparatuses for determining in-plane distortion (IPD) across a substrate having a plurality of patterned regions. A method includes obtaining intra-region data indicative of a local stress distribution across one of the plurality of patterned regions; determining, based on the intra-region data, inter-region data indicative of a global stress distribution across the substrate; and determining, based on the inter-region data, the IPD across the substrate.

20 Claims, 6 Drawing Sheets

(56) References Cited

U.S. PATENT DOCUMENTS

| | | | |
|---|---|---|---|
| 2016/0161863 A1 | 6/2016 | Den Boef et al. | |
| 2016/0290789 A1 | 10/2016 | Smith et al. | |
| 2016/0370717 A1 | 12/2016 | Den Boef et al. | |
| 2016/0371423 A1 | 12/2016 | Vukkadala et al. | |
| 2018/0342410 A1* | 11/2018 | Hooge | H01L 22/30 |
| 2019/0041758 A1* | 2/2019 | Van Dijk | G03F 7/70516 |

FOREIGN PATENT DOCUMENTS

| | | | |
|---|---|---|---|
| WO | 2017140532 | 8/2017 | |
| WO | WO-2017140532 A1 * | 8/2017 | G03F 9/7034 |

OTHER PUBLICATIONS

Taiwanese Office Action issued in corresponding Taiwanese Patent Application No. 108126725, dated Apr. 9, 2020.

Taiwanese Office Action issued in corresponding Taiwanese Patent Application No. 108126725, dated Jul. 31, 2020.

Turner, K.T., et al.: "Relationship between localized wafer shape changes induced by residual stress and overlay errors", Journal of Micro/Nanolithography, MEMS, and MOEMS, vol. 11, No. 1., Mar. 21, 2012.

* cited by examiner

METROLOGY APPARATUS

CROSS-REFERENCE TO RELATED APPLICATIONS

This application is the U.S. national phase entry of PCT Patent Application No. PCT/EP2019/067885 which was filed on Jul. 3, 2019, which claims the benefit of priority of European Patent Application No. 18190150.5 which was filed on Aug. 22, 2018 and which is incorporated herein in its entirety by reference.

FIELD

The invention relates to a metrology apparatus and associated methods for determining an in-plane distortion (IPD) across a substrate, such as a semiconductor wafer.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer). The projected pattern may form part of a process to fabricate a structure onto the substrate.

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and not yet published U.S. patent application Ser. No. 15/181,126, incorporated herein by reference in its entirety.

A substrate may comprise a plurality of patterned regions, which may also be referred to as dies or fields. Intra-field stress is one of the major overlay challenges for manufacturers of ICs, in particular 3D NAND ICs. High intra-field stress levels may originate from a 3D NAND architecture, which requires the deposition of a large number of bi-layers, for example nitride-oxide-nitride-oxide (NONO). Furthermore, intra-field stress may not be uniform throughout an exposure field when exposing a patterned region. Each die may contain a memory array, having high stress levels, and a periphery (e.g. for logic) that may have lower stress levels. This may result in very high order distortion patterns throughout the field.

Although intra-field stress induces significant intra-field overlay errors, it is possible to correct these errors to a large extent. However, intra-field stress may also result in higher order inter-field distortion patterns (i.e across multiple dies) that cannot be corrected for by current available wafer alignment models. In addition high order inter-field distortion patterns are very hard to characterize with current overlay metrology as overlay measurement targets are mostly placed in the scribelane(s), whereas most distortion happens in the product area (e.g. between scribelanes).

SUMMARY

According to an aspect of the invention, there is provided a method for determining in-plane distortion (IPD) across a substrate comprising a plurality of patterned regions, the method comprising: obtaining intra-region data indicative of a local stress distribution across one of the plurality of patterned regions; determining, based on the intra-region data, inter-region data indicative of a global stress distribution across the substrate; and determining, based on the inter-region data, the IPD across the substrate.

Optionally, the method further comprises obtaining the intra-region data based on measurement of one or more geometric characteristics of the substrate.

Optionally, the measured one or more geometric characteristics comprises an out-of-plane shape of the substrate.

Optionally, obtaining the intra-region data further comprises determining a second derivative of the measured one or more geometric characteristics.

Optionally, determining the second derivative of the measured one or more geometric characteristics comprises determining a second derivative of the measured one or more geometric characteristics along a particular in plane direction and/or determining a mixed second derivative of the measured one or more geometric characteristics along two non-parallel in plane directions.

Optionally, obtaining the intra-region data further comprises averaging the determined second derivative across the plurality of patterned regions.

Optionally, the intra-region data is obtained based on a layout of the patterns in the patterned regions.

Optionally, the layout of the patterns is determined based on one or more of field layout, die layout, chip layout and reticle layout.

Optionally, the intra-region data is obtained based on material properties associated with the substrate and/or the features of the patterns.

Optionally, the intra-region data is obtained based on data associated with a stack of features forming at least part of the patterns.

Optionally, the intra-region data is obtained based on measurements of an in plane displacement of one or more features forming at least part of the patterns.

Optionally, the inter-region data is determined based on the intra-region data using a finite element method.

Optionally, the method further comprises determining an out-of-plane distortion (OPD) and an IPD based on the intra-region data using a finite element method.

Optionally, the method further comprises adding the determined OPD and IPD based on a result of the finite element method to a library comprising a plurality of OPDs against IPDs for a set of predefined top film stresses.

Optionally, the method further comprises determining an IPD of a further substrate based on a measurement of one or more geometric characteristics of the further substrate and the OPDs and IPDs in the library.

Optionally, the one or more geometric characteristics of the further substrate comprises an OPD shape of the further substrate, and wherein determining the IPD of the further substrate comprises fitting the OPD shape of the further substrate to one or more of the plurality OPDs in the library, and determining the IPD based on the IPDs corresponding to the one or more of the plurality OPDs.

Optionally, determining the IPD of the further substrate comprises fitting the OPD shape of the further substrate to a plurality OPDs in the library, each of the plurality of OPDs being weighted in the fit, and wherein determining the IPD comprises summing the IPDs corresponding to the plurality OPDs in the fit, weighted based on the weights of the plurality of OPDs.

Optionally, the method further comprises one or both of: applying corrections to a lithographic apparatus based on the determined IPD; and controlling alignment of the substrate in a lithographic apparatus based on the determined IPD.

Optionally, the regions comprise fields or dies fabricated on a semiconductor wafer.

According to an aspect of the invention, there is provided a computer program comprising instructions which, when executed on at least one processor, cause the at least one processor to control an apparatus to carry out a method as described herein.

According to an aspect of the invention, there is provided a carrier containing a computer program as described herein, wherein the carrier is one of an electronic signal, optical signal, radio signal, or non-transitory computer readable storage medium.

According to an aspect of the invention, there is provided an apparatus for determining in-plane distortion (IPD) of a substrate comprising a plurality of patterned regions, the apparatus comprising a computer processor configured to undertake the method of: obtaining intra-region data indicative of a local stress distribution across one of the plurality of patterned regions on the substrate; determining, based on the intra-region data, inter-region data indicative of stress distribution across a plurality of the substrate; and determining, based on the inter-region data, the IPD across the substrate.

According to an aspect of the invention, there is provided a lithographic apparatus comprising an apparatus for determining IPD as described herein.

According to an aspect of the invention, there is provided a litho-cell comprising a lithographic apparatus as described herein.

BRIEF DESCRIPTION OF DRAWINGS

Embodiments of the invention will now be described, by way of example only, with reference to the accompanying schematic drawings, in which.

DETAILED DESCRIPTION

Generally, disclosed herein are methods and apparatus for determining IPD across a substrate. In exemplary arrangements, this may be achieved by determining intra-field (or intra-region) stress data specifying a local stress distribution across a field and based on that intra-field stress data determining inter-field stress data specifying a stress distribution across a plurality of fields. IPD may then be determined based on the inter-field stress data.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
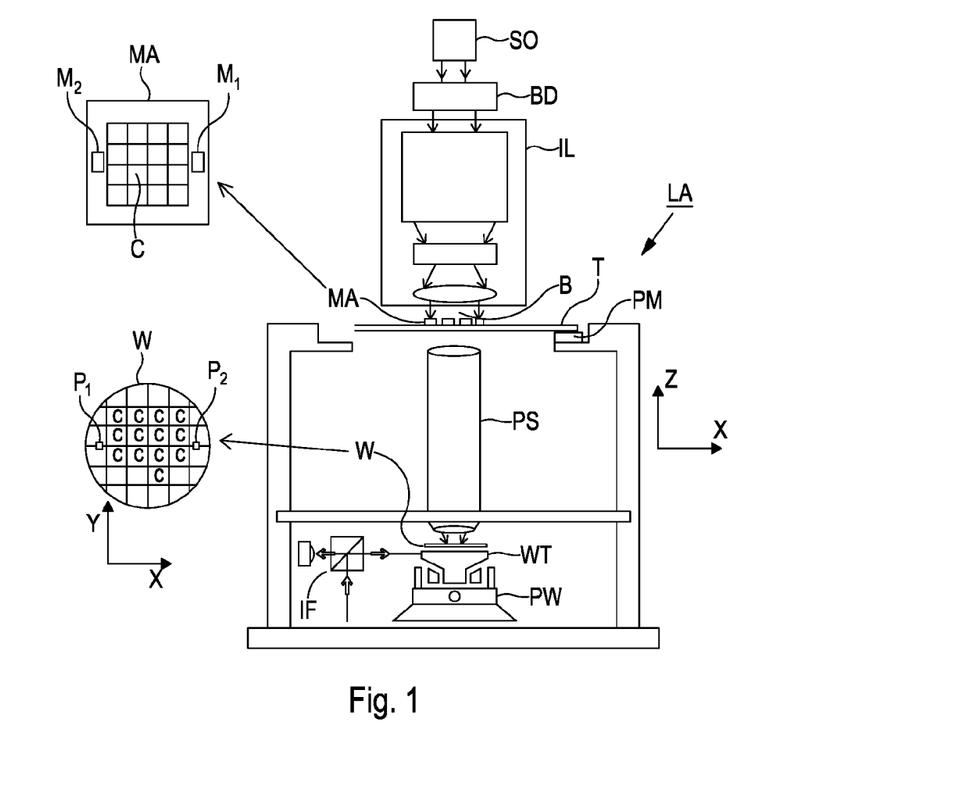
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks Pl, P2 as illustrated occupy dedicated target portions, they may be located in spaces between target portions. Substrate alignment marks P1, P2 are known as scribe-lane alignment marks when these are located between the target portions C.

Figure 2:
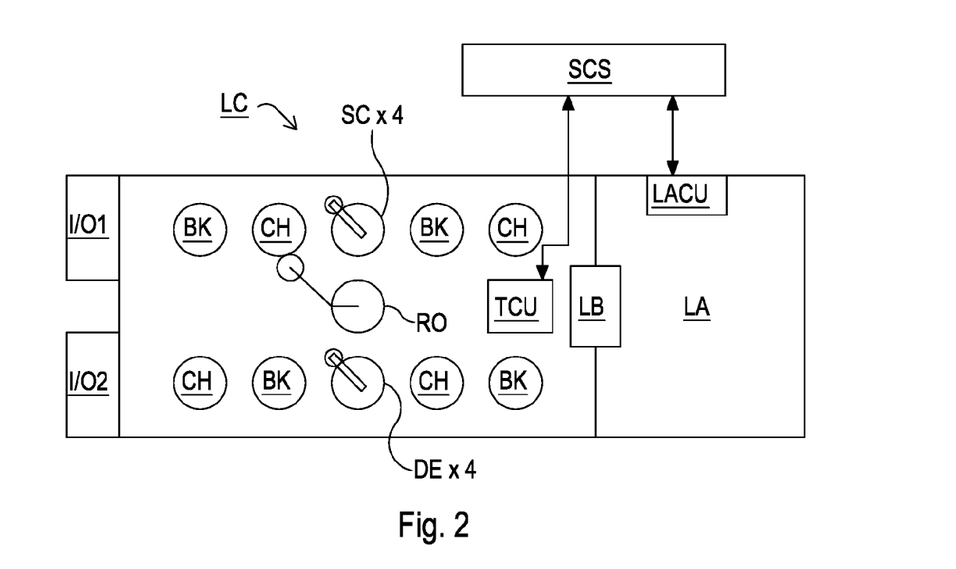
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology tool, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
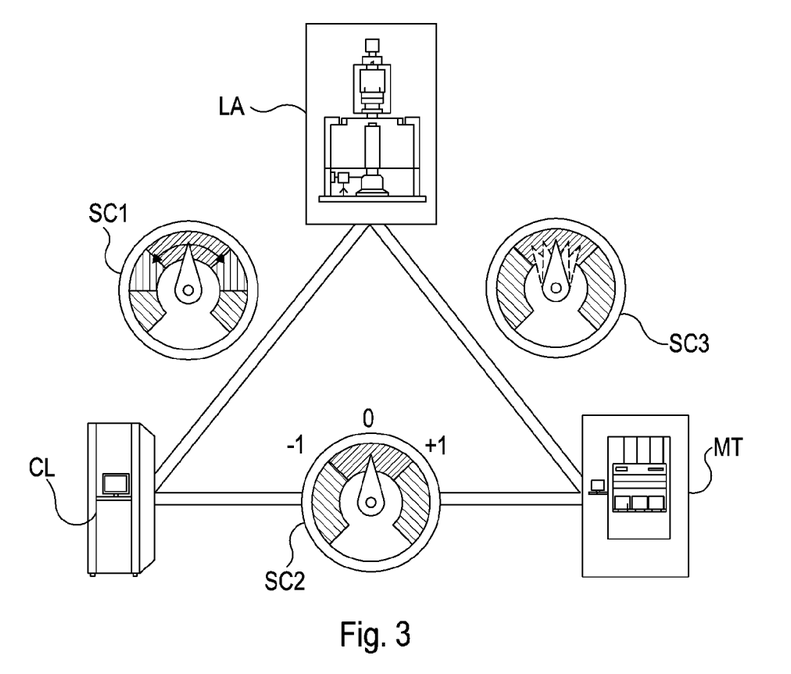
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

Figure 4:
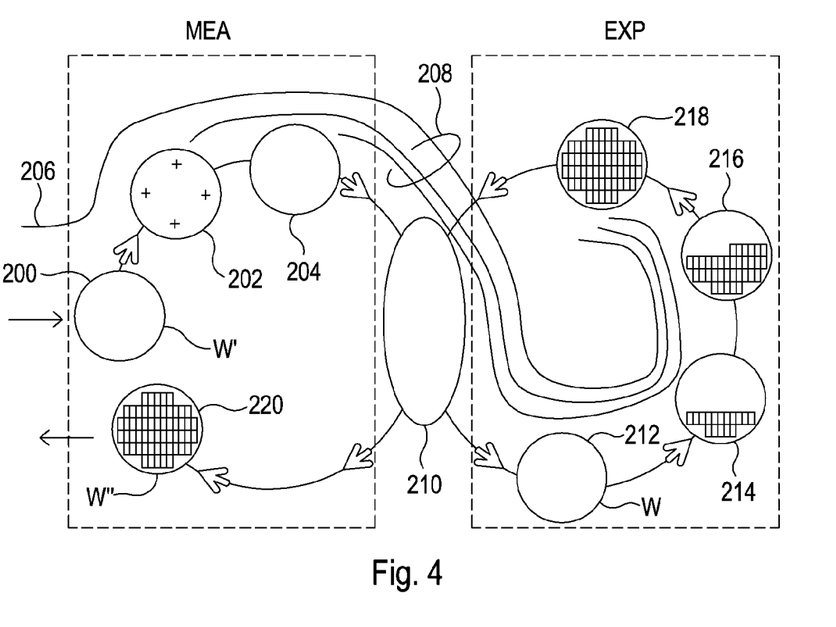
FIG. 4 illustrates exemplary steps to expose patterned regions on a substrate.

FIG. 4 illustrates exemplary steps to expose patterned regions (e.g. dies) on a substrate W in the dual stage apparatus of FIG. 1. The process according to conventional practice will be described first. The present disclosure is by no means limited to dual stage apparatus of the illustrated type. The skilled person will recognize that similar operations are performed in other types of lithographic apparatus, for example those having a single substrate stage and a docking metrology stage.

On the left hand side within a dotted box are steps performed at measurement station MEA, while the right hand side shows steps performed at exposure station EXP. From time to time, the substrate table WT will be at the exposure station or at the measurement station. The exposure station and the measurement station may be collocated. In exemplary arrangements, there may be two wafer tables, each carrying a substrate W and W'. For the purposes of this description, it is assumed that a substrate W has already been loaded into the exposure station.

At step 200, a second substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, a task is to ensure that new patterns are applied in exactly the correct position on a substrate that has already been subjected to one or more cycles of patterning and processing. Each patterning step can introduce positional deviations in the applied pattern, while subsequent processing steps progressively introduce distortions, such as IPD, in the substrate and/or the pattern applied to it that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation. Some layers may be patterned by steps that are alternative or supplementary to exposure in the illustrated lithographic apparatus. Such alternative and supplementary techniques include for example imprint lithography, self-aligned multiple patterning and directed self-assembly. Similarly, other processing steps performed per layer (e.g., CMP and etch) may be performed on different apparatuses per layer.

At 202, alignment measurements using the substrate marks P1 etc. and image sensors (not shown) are used to measure and record alignment of the substrate relative to substrate table WT. In addition, several alignment marks across the substrate W' will be measured using alignment sensor AS. These measurements are used in one embodiment to establish a substrate model (sometimes referred to as the "wafer grid"), which maps very accurately the distribution of marks across the substrate, including any distortion relative to a nominal rectangular grid.

At step 204, a geometric characteristic, such as a map of wafer height (Z) against X-Y position, is measured using the level sensor LS. Primarily, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. Where there is a choice of alignment marks on the substrate, and where there is a choice of settings of an alignment sensor, these choices are defined in an alignment recipe among the recipe data 206. The alignment recipe therefore defines how positions of alignment marks are to be measured, as well as which marks.

At 210, wafers W' and W are swapped, so that the measured substrate W' becomes the substrate W entering the exposure station EXP. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Substrate distortion may impact overlay performance in a lithographic process. Substrate distortion may result from a thermal treatment of the substrate (e.g. laser anneal) or deposition of stressed thin films. The free-form substrate shape, which can be measured with off-line metrology tools, may change as a result of this distortion. Typical shapes which may be observed in high volume manufacturing are bowl (concave), umbrella (convex), and saddle shapes. Deviations from these shapes result in higher order in-plane distortions. In most cases, these in-plane distortions are slowly spatially varying functions that can be captured by existing alignment models, such as (for example) high order wafer alignment (HOWA) models. Another approach is to use free-form substrate shape measurements. Where the relationship between free-form substrate shape and in-plane distortion after clamping is known or can be modelled, predictions (and corrections) can be made to improve overlay performance.

In situations where stress distribution varies as function of the substrate position or where stressed layers are also deposited on the back-side of the substrate, predicting the in-plane distortion becomes more difficult. By way of a specific example, inhomogeneous stressed thin film layers (e.g., of silicon nitride) may be deposited on both the front and backside of the substrate; these films may be sufficiently similar such that the free-form substrate shape remains flat. In such a case, the in-plane distortion cannot be predicted from a free-form substrate shape measurement. It is also difficult to capture the in-plane distortion using a proper alignment model since the stress distribution may be too high frequent to properly capture and/or have sharp transitions. This may happen when there are both patterned and non-patterned (e.g., edge) fields on the substrate. In addition, the processing fingerprint may conflict with the stress fingerprint due to, for example, alignment mark deformation.

The inventors have appreciated that local intra-field stress may cause higher order distortion patterns across a substrate. Specifically, intra-field stress may cause higher order IPD across a substrate.

Figure 5:
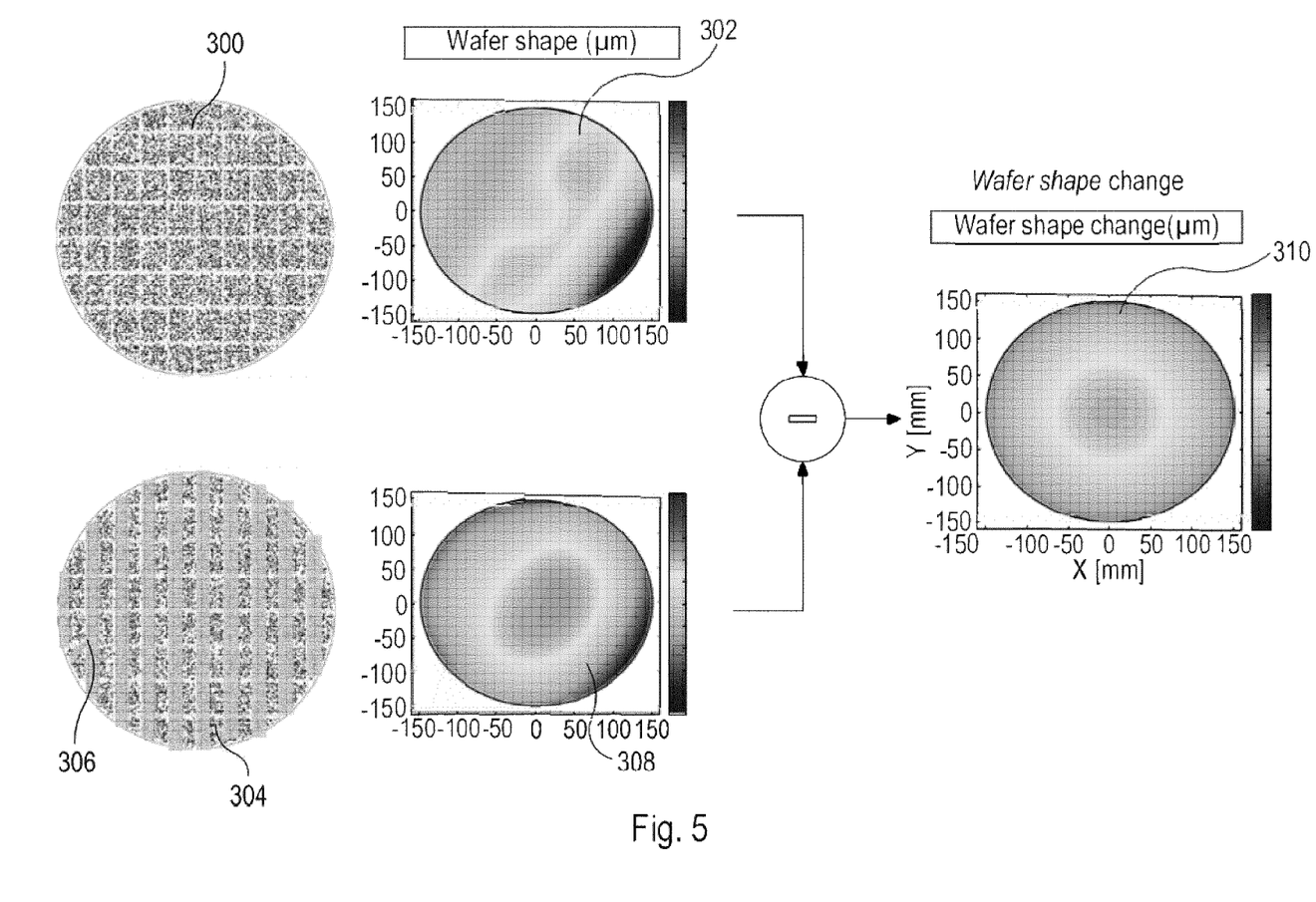
FIG. 5 shows schematically an example of local intra-field stress causing higher order distortion patterns across a substrate.

A change in free-form wafer shape (out-of-plane deviation) due to processing is illustrated in FIG. 5. A substrate 300, such as a semiconductor wafer, has alignment marks etched into it. The wafer is readout on a wafer shape measurement tool to determine an OPD wafer shape 302 (the grey level being indicative for a deviation of the wafer surface from a nominal value). In this case the wafer has a diameter of 300 mm, hence the X, Y coordinates are scaled between −150 and +150 mm (as shown in FIG. 5). In order to create a distortion pattern on the wafer 300, a stressed nitride layer is deposited on the wafer and partially etched away again from each field to produce a processed wafer 304 comprising a plurality of areas 306 covered with nitride, which introduces local intra-field stress. In addition the impact 310 of the stressed layer on the wafer shape is shown in FIG. 5. The processed wafer 304 is readout on the wafer shape measurement tool again to determine the OPD wafer shape 308. The processed induced wafer OPD deformation 310 can be isolated by subtracting the processed OPD wafer shape 308 from the unprocessed OPD wafer shape 302.

Figure 6:
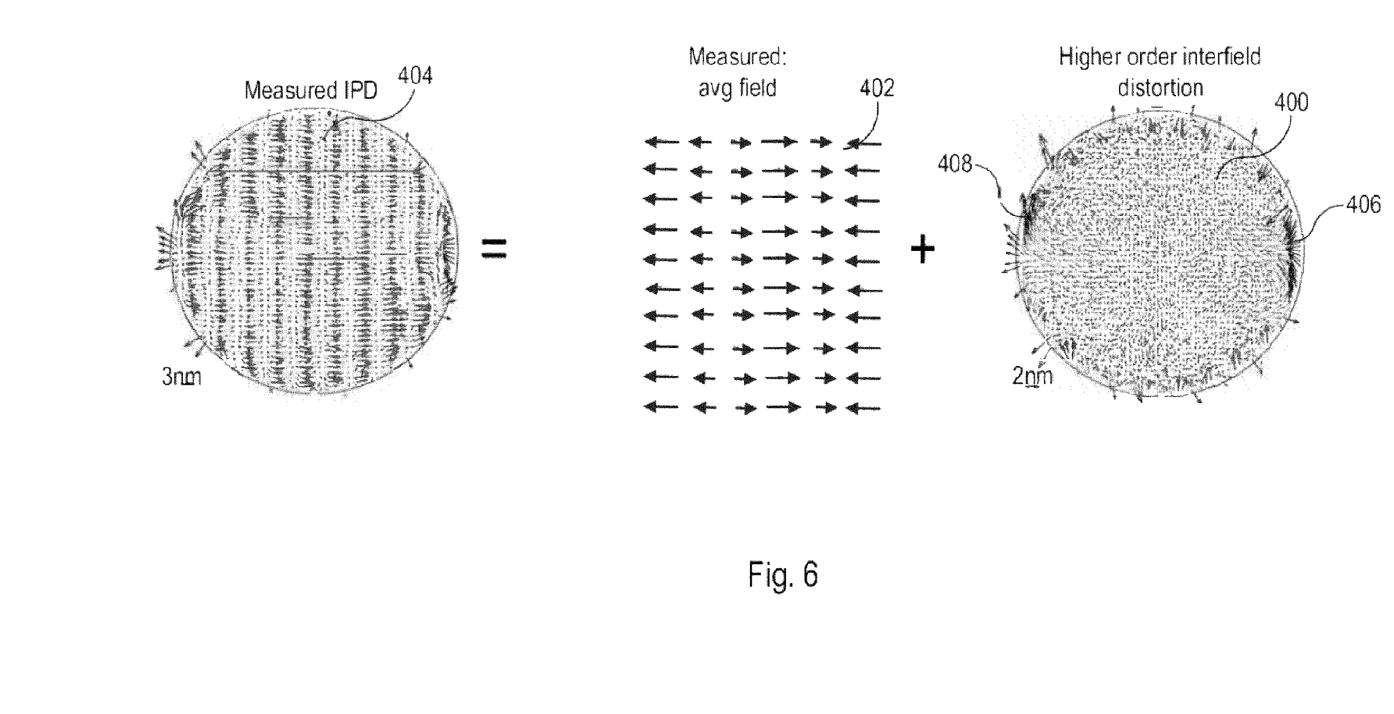
FIG. 6 shows schematically that higher order inter-field IPD of a processed wafer may be determined by subtracting an average IPD for each field from a measured IPD of the processed wafer.

The resulting IPD 400 of the processed wafer 304 that is due to higher order inter-field IPD is shown in FIG. 6. As shown in FIG. 6, the higher order inter-field IPD 400 of the processed wafer 304 may be determined by subtracting an average IPD 402 for each field from a measured IPD 404 of the processed wafer 400. The measured IPD 404 of the processed wafer 304 due to nitride deposition and partial removal from each field contains a significant intra-field component. When the IPD 402 of an average field is removed from the measured IPD 404, there is still a significant higher order inter-field IPD pattern 400 left, as can clearly be seen in the right hand wafer plot in FIG. 6. The higher order inter-field IPD pattern manifests itself mostly towards the wafer edge. However, at 3 o'clock 406 and 9 o'clock 408 positions the higher order inter-field IPD is also significant in the inner wafer area. Simulations have confirmed that the higher order inter-field distortion pattern is indeed introduced by an intra-field stress pattern. Using Finite Element Methods (FEM), the higher order inter-field IPD was calculated by assuming uniform stripes of nitride on top of the wafer and exhibited a similar pattern as measured.

Figure 7:
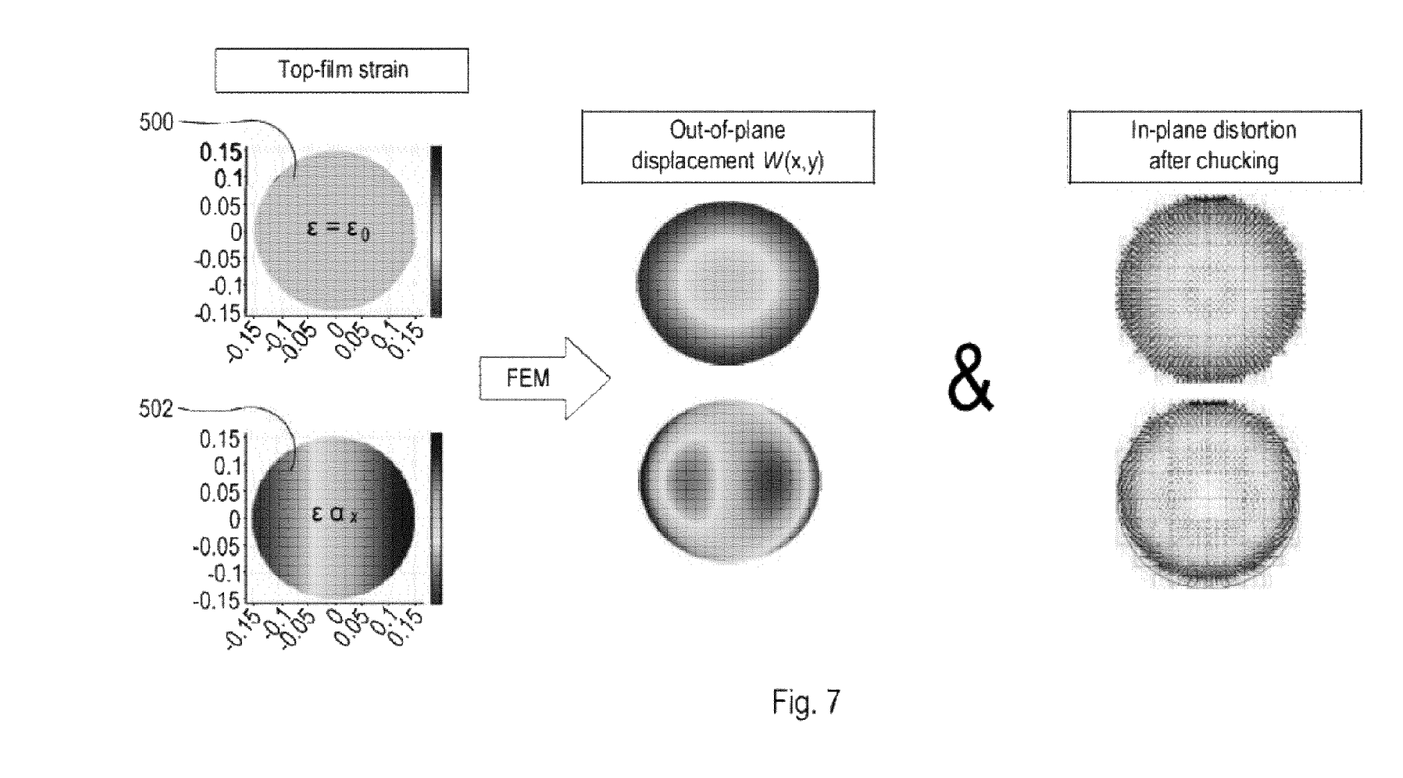
FIG. 7 shows schematically the use of a constant top film strain and a linear top film strain in an FEM to determine IPD and OPD.

In known arrangements, for a set of predefined polynomial top-film strains, the OPDs (free form substrate shapes) and IPDs after chucking are determined using Finite Element methods (FEM). For example, and as shown in FIG. 7, a constant top film strain 500 and a linear top film strain 502 may be used as well as other predefined top film strains, as necessary. This creates a library of OPDs and corresponding IPDs when chucking such a substrate shape. The library creation need only be done once.

After the library is created, an OPD shape of a substrate may be measured and fitted to the OPDs from the predefined top film polynomial strains in the library. In exemplary arrangements, the fit may comprise a plurality of weighted OPDs from the library. Using the fit weights as coefficients, the top film strain can be reconstructed.

With the top film strain known, the resulting IPD after chucking can be constructed using the same coefficients by adding up the IPD corresponding to each polynomial pre-strain weighted by the same coefficients.

To have a unique relationship between substrate shape and top-film strain, it is assumed that the top film strain has the structure of an isotropic thermal deformation (strain_x=strain_y, no shear).

This methodology can be used to predict IPD from wafer shape. However, in cases where the second order residual of the free form wafer shape is very high order, like is the case for intra-field stress induced interfield distortion, this method is not feasible in practice.

Figure 8:
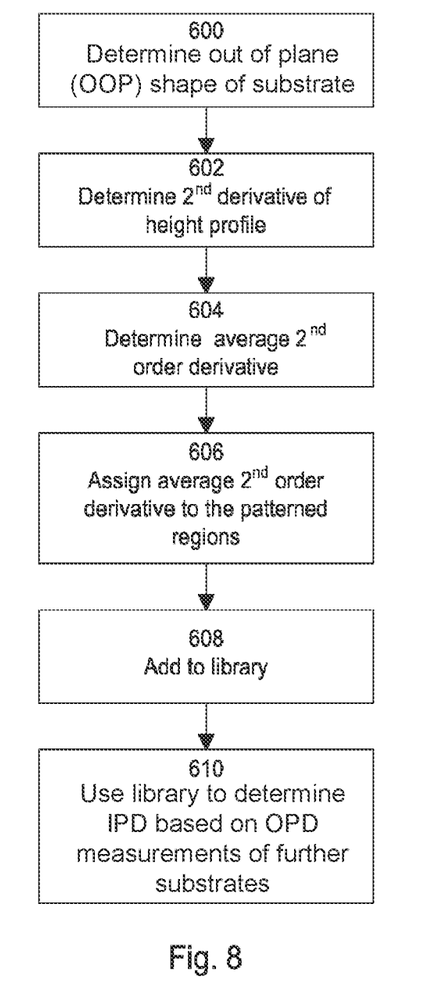
FIG. 8 is a flow diagram showing a method for determining IPD across a substrate.

FIG. 8 shows a flow diagram for a method of determining IPD across a substrate. The substrate comprises a plurality of patterned regions (or dies or fields).

An intra-field stress pattern is first determined, which specifies a local stress pattern within at least one of the plurality of patterned regions. In one exemplary arrangement, the intra-field stress pattern may be determined based on a geometric characteristic, such as OPD shape of the substrate. That is, a measurement may be undertaken 600 to determine a height profile of the substrate. A second derivative of the height profile of the substrate may be determined 602, which is proportional to a distribution of the stress over the substrate. Following this, an average second order derivative over each of a plurality of patterned regions may be determined 604 based on the second order derivative of the height profile. The average second order derivative is an estimate of the intra-field stress pattern for each of the patterned regions.

The average second order derivative of the height profile is assigned 606 to two or more of the plurality of patterned regions.

Using the average second order derivative that has been assigned to the patterned regions, which is indicative of the intra-field stress, a finite element method is used to determine 608 an IPD and an OPD of the substrate. The determined IPD contains both the intra-field IPD and the higher order inter-field IPD discussed above.

The determined IPD and OPD of the substrate containing both the intra-field IPD and the higher order inter-field IPD is added to the library discussed above for the determination of IPD based on OPD substrate shape.

By adding an IPD and OPD related to intra-field stress to the library, the substrate shape based IPD prediction can be enabled, also in cases where the intra-field stress induced IPD (inter-field) is very higher order.

In other exemplary arrangements, the intra-field data may be inferred from layout data associated with the patterned regions. The layout data may be determined based on one or more of field layout, die layout, chip layout or reticle layout. Alternatively or in addition, the intra-field stress data may be determined based on material properties of the substrate and/or material properties of the features fabricated on the substrate and forming the patterns of the patterened regions. Alternatively or in addition, intra-field stress data may be determined based on data associated with a stack of features forming at least part of the patterns. Alternatively or in addition, the intra-field stress data may be determined based on measurements of an in plane displacement of one or more features forming at least part of the patterns.

Based on the layout and/or the material properties, the intra-field stress data may be determined based on modelling, which would be understood by a skilled person.

Further embodiments of the invention are disclosed in the list of numbered embodiments below:

1. A method for determining in-plane distortion (IPD) across a substrate comprising a plurality of patterned regions, the method comprising:
   obtaining intra-region data indicative of a local stress distribution across one of the plurality of patterned regions;
   determining, based on the intra-region data, inter-region data indicative of a global stress distribution across the substrate; and
   determining, based on the inter-region data, the IPD across the substrate.
2. The method according to embodiment 1, further comprising obtaining the intra-region data based on measurement of one or more geometric characteristics of the substrate.
3. The method according to embodiment 2, wherein the measured one or more geometric characteristics comprises an out-of-plane shape of the substrate.
4. The method according to embodiment 2 or 3, wherein obtaining the intra-region data further comprises determining a second derivative of the measured one or more geometric characteristics.
5. The method according to embodiment 4, wherein determining the second derivative of the measured one or more geometric characteristics comprises determining a second derivative of the measured one or more geometric characteristics along a particular in plane direction and/or determining a mixed second derivative of the measured one or more geometric characteristics along two non-parallel in plane directions.
6. The method according to embodiment 4 or 5, wherein obtaining the intra-region data further comprises averaging the determined second derivative across the plurality of patterned regions.
7. The method according to any preceding embodiment, wherein the intra-region data is obtained based on a layout of the patterns in the patterned regions.
8. The method according to embodiment 7, wherein the layout of the patterns is determined based on one or more of field layout, die layout, chip layout and reticle layout.
9. The method according to embodiment 7 or 8, wherein the intra-region data is obtained based on material properties associated with the substrate and/or the features of the patterns.
10. The method according to any of embodiments 7 to 9, wherein the intra-region data is obtained based on data associated with a stack of features forming at least part of the patterns.
11. The method according to any of embodiments 7 to 10, wherein the intra-region data is obtained based on measurements of an in plane displacement of one or more features forming at least part of the patterns.
12. The method according to any preceding embodiment, wherein the inter-region data is determined based on the intra-region data using a finite element method.
13. The method according to embodiment 12, further comprising determining an out-of-plane distortion (OPD) and an IPD based on the intra-region data using a finite element method.
14. The method according to embodiment 13, further comprising adding the determined OPD and IPD based on a result of the finite element method to a library comprising a plurality of OPDs against IPDs for a set of predefined top film stresses.
15. The method according to embodiment 14, further comprising determining an IPD of a further substrate based on a measurement of one or more geometric characteristics of the further substrate and the OPDs and IPDs in the library.
16. The method according to embodiment 15, wherein the one or more geometric characteristics of the further substrate comprises an OPD shape of the further substrate,
   and wherein determining the IPD of the further substrate comprises fitting the OPD shape of the further substrate to one or more of the plurality of OPDs in the library, and determining the IPD based on the IPDs corresponding to the one or more of the plurality of OPDs.
17. The method according to embodiment 16, wherein determining the IPD of the further substrate comprises fitting the OPD shape of the further substrate to a plurality of OPDs in the library, each of the plurality of OPDs being weighted in the fit,
   and wherein determining the IPD comprises summing the IPDs corresponding to the plurality OPDs in the fit, weighted based on the weights of the plurality of OPDs.
18. The method according to any preceding embodiment, further comprising one or both of: applying corrections to a lithographic apparatus based on the determined IPD; and controlling alignment of the substrate in a lithographic apparatus based on the determined IPD.
19. The method according to any preceding embodiment, wherein the regions comprise fields or dies fabricated on a semiconductor wafer.

20. A computer program comprising instructions which, when executed on at least one processor, cause the at least one processor to control an apparatus to carry out the method according to any of embodiments 1 to 19.

21. A carrier containing the computer program of embodiment 20, wherein the carrier is one of an electronic signal, optical signal, radio signal, or non-transitory computer readable storage medium.

22. An apparatus for determining in-plane distortion (IPD) of a substrate comprising a plurality of patterned regions, the apparatus comprising a computer processor configured to undertake the method of:

obtaining intra-region data indicative of a local stress distribution across one of the plurality of patterned regions on the substrate;

determining, based on the intra-region data, inter-region data indicative of stress distribution across a plurality of the substrate; and determining, based on the inter-region data, the IPD across the substrate.

23. A lithographic apparatus comprising the apparatus according to embodiment 22.

24. A litho-cell comprising the lithographic apparatus according to embodiment 23.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

The skilled person will be able to envisage other embodiments without departing from the scope of the appended claims.

The invention claimed is:

1. A method for determining in-plane distortion (IPD) across a substrate comprising a plurality of patterned regions, the method comprising:

obtaining intra-region data indicative of a local stress distribution across at least one out of the plurality of patterned regions;

assigning the same intra-region data to at least two patterned regions out of the plurality of patterned regions;

determining, based on the intra-region data assigned to the at least two patterned regions, inter-region data indicative of a global stress distribution across the substrate; and determining, based on the inter-region data, the IPD across the substrate.

2. The method according to claim 1, further comprising obtaining the intra-region data based on measurement of one or more geometric characteristics of the substrate.

3. The method according to claim 2, wherein the measured one or more geometric characteristics comprises an out-of-plane shape of the substrate.

4. The method according to claim 2, wherein obtaining the intra-region data further comprises determining a second derivative of the measured one or more geometric characteristics.

5. The method according to claim 4, wherein determining the second derivative of the measured one or more geometric characteristics comprises determining a second derivative of the measured one or more geometric characteristics along a particular in plane direction and/or determining a mixed second derivative of the measured one or more geometric characteristics along two non-parallel in plane directions.

6. The method according to claim 4, wherein obtaining the intra-region data further comprises averaging the determined second derivative across the plurality of patterned regions.

7. The method according to claim 1, wherein the intra-region data is obtained based on a layout of one or more patterns in the patterned regions.

8. The method according to claim 7, wherein the layout of the patterns is determined based on one or more selected from: field layout, die layout, chip layout and/or reticle layout.

9. The method according to claim 7, wherein the intra-region data is obtained based on one or more material properties associated with the substrate and/or the features of the one or more patterns.

10. The method according to claim 7, wherein the intra-region data is obtained based on data associated with a stack of features forming at least part of the one or more patterns.

11. The method according to claim 7, wherein the intra-region data is obtained based on measurements of an in plane displacement of one or more features forming at least part of the one or more patterns.

12. The method according to claim 1, wherein the inter-region data is determined based on the intra-region data assigned to the at least two patterned regions, using a finite element method.

13. The method according to claim 12, further comprising determining an out-of-plane distortion (OPD) and an IPD based on the intra-region data assigned to the at least two patterned regions, using a finite element method.

14. The method according to claim 13, further comprising adding the determined OPD and IPD based on a result of the finite element method to a library comprising a plurality of OPDs against IPDs for a set of predefined top film stresses.

15. The method according to claim 14, further comprising determining an IPD of a further substrate based on a measurement of one or more geometric characteristics of the further substrate and on the OPDs and IPDs in the library.

16. The method according to claim 15, wherein the one or more geometric characteristics of the further substrate comprises an OPD shape of the further substrate, and wherein determining the IPD of the further substrate comprises fitting the OPD shape of the further substrate to one or more of the plurality of OPDs in the library, and determining the IPD based on the IPDs corresponding to the one or more of the plurality of OPDs.

17. The method according to claim 16, wherein determining the IPD of the further substrate comprises fitting the OPD shape of the further substrate to a plurality of OPDs in the library, each of the plurality of OPDs being weighted in the fit, and wherein determining the IPD comprises summing the IPDs corresponding to the plurality OPDs in the fit, weighted based on the weights of the plurality of OPDs.

18. The method according to claim 1, further comprising applying a correction to a lithographic apparatus based on the determined IPD and/or controlling alignment of a substrate in a lithographic apparatus based on the determined IPD.

19. A computer program product comprising a non-transitory computer-readable medium having instructions therein, the instructions, when executed by a computer system, configured to cause the computer system to at least:

obtain intra-region data indicative of a local stress distribution across at least one out of a plurality of patterned regions across a substrate;

assign the same intra-region data to at least two patterned regions out of the plurality of patterned regions;

determine, based on the intra-region data assigned to the at least two patterned regions, inter-region data indicative of a global stress distribution across the substrate; and determine, based on the inter-region data, in-plane distortion (IPD) across the substrate.

20. The computer program product of claim 19, wherein the instructions configured to cause the computer system to determine the inter-region data based on the intra-region data assigned to the at least two patterned regions are configured to do so based on a finite element method.

* * * * *